United States Patent [19]

Chang et al.

[11] Patent Number: 5,185,274
[45] Date of Patent: Feb. 9, 1993

[54] SELF-ALIGNED, SELF-PASSIVATED ADVANCED DUAL LIFT-OFF HETEROJUNCTION BIPOLAR TRANSISTOR METHOD

[75] Inventors: Mau C. F. Chang, Thousand Oaks; Peter M. Asbeck, San Diego, both of Calif.

[73] Assignee: Rockwell International Corporation, Seal Beach, Calif.

[21] Appl. No.: 746,259

[22] Filed: Aug. 15, 1991

[51] Int. Cl.$^5$ .................. H01L 21/265; H01L 29/70
[52] U.S. Cl. ........................... 437/22; 437/31; 437/80; 437/944; 357/16; 357/34; 257/198; 257/523
[58] Field of Search ............ 437/31, 22; 148/100, 148/143; 357/34, 16

[56] References Cited

U.S. PATENT DOCUMENTS

| | | | |
|---|---|---|---|
| 4,731,340 | 3/1988 | Chang et al. | 437/31 |
| 4,889,831 | 12/1989 | Ishii et al. | 437/133 |
| 4,996,165 | 2/1991 | Chang et al. | 437/31 |
| 5,124,270 | 6/1992 | Morizuka | 437/31 |

Primary Examiner—Olik Chaudhuri
Assistant Examiner—Long Pham
Attorney, Agent, or Firm—Wilfred G. Caldwell; John J. Deinken

[57] ABSTRACT

Heterojunction bipolar transistor is formed by using a common photoresist mask for self-aligning all critical dimensions including emitter and emitter contact to base contact to proton damaged collector regions beneath base contact and to passivate emitter periphery at same time.

6 Claims, 6 Drawing Sheets

SELF-ALIGNED, SELF-PASSIVATED ADVANCED DUAL LIFT-OFF HETEROJUNCTION BIPOLAR TRANSISTOR METHOD

BACKGROUND OF THE INVENTION

1. Field of the Invention

Passivated heterojunction bipolar transistor (HBT) uses common mask to self-align all critical dimensions while also passivating emitter periphery.

2. Prior Art

U.S. Pat. Nos. 4,731,340 and 4,996,165 to Chang et al. best represent the known published prior art. The latter patent discloses a self-aligned dielectric assisted planarization process useful in planarizing the present invention, and the former patent discloses a dual lift-off self-aligning process for making HBTs, also useful in the process of the present invention. Dual lift-off process lifts off metal and dielectric, simultaneously. All inventions are commonly owned, and the inventors thereof are employed by the common assignee.

SUMMARY OF THE INVENTION

The invention is a process, for producing unique HBTs, employing an advanced dielectric/meal dual lift-off step, which self-aligns all critical dimensions using a single photoresist mask and also simultaneously passivates the emitter peripheral areas comprising a thin aluminum gallium arsenide layer. An HBT semiconductor wafer is made using a gallium arsenide substrate, N+ gallium arsenide subcollector, N— gallium arsenide collector, P+ gallium arsenide base, N— aluminum gallium arsenide emitter and a cap of N+ gallium arsenide over the emitter and a top cap layer of N+ indium gallium arsenide to make up an NPN device. Suitable sign changes will develop PNP devices as is well known. A mesa is formed down through the base layer and planarized. The important photoresist mask is formed, and the mesa and photoresist are etched down to the aluminum gallium arsenide emitter layer about the effective emitter region while forming the base contact region around the emitter. Thin photo CVD silicon nitride is deposited to cover the emitter contact sidewalls and peripheral regions of the emitter aluminum gallium arsenide. In order to retain silicon nitride on the sidewall and undercut region of the emitter, low pressure CF4 (carbon tetrafluoride) reactive ion anisotropic etching is used to open the silicon nitride covered base contact portions. Next, selective wet etching uncovers the center portions of the base contact regions, and leaves a depleted thin aluminum gallium arsenide layer, protected by silicon nitride to passivate the emitter peripheral region automatically. Thus, all critical dimensions are aligned using a single photoresist mask with passivation achieved at the same time. The regions under the base contact area is proton damaged to localize carrier flow, the base contact is then deposited, the base-interconnect is applied, the collector contact region is etched, and the collector contact and interconnects are conventionally applied. The emitter contact is formed directly by the interconnection metal.

DETAILED DESCRIPTION OF A PREFERRED EMBODIMENT OF THE INVENTION

Figure 1:
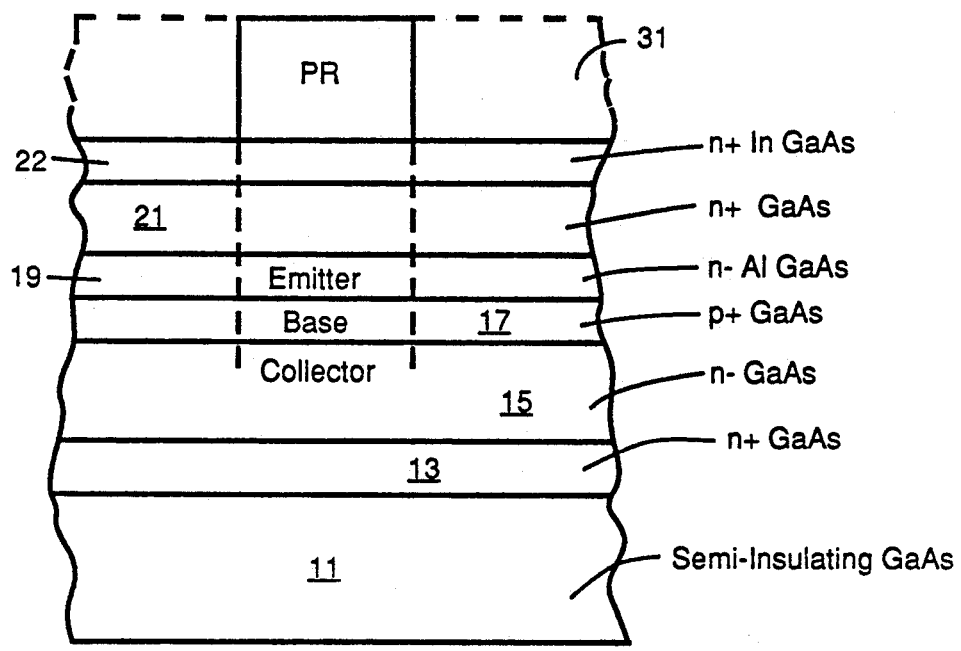
FIG. 1 shows a semiconductor wafer with patterned photoresist to define a base mesa.

The current gain in HBTs increases with the use of a depleted thin AlGaAs layer passivated around the emitter. Without this passivation, self-aligned HBTs posses low current gains and are unsuitable for high fan-out gate-arrays and high resolution ACDs. To meet the increasing system need in monolithically integrated both analog and digital circuits for multifunctional IC applications, the present advanced dual lift-off process has been developed. The process not only self-aligns all critical dimensions with a single photoresist mask but also self-passivates the emitter peripheral areas with a thin AlGaAs layer at the same time. Advanced dual lift-off HBTs, which posses low device parasitics and high current gains, can provide the best performance, efficiency and manufacturability for future analog/digital combination circuits.

Considering now FIGS. 1 through 5, it will be seen that the semi-insulating substrate 11, preferably gallium arsenide, forms the support for the layers to be deposited or built thereon. First, the subcollector layer 13 of gallium arsenide is deposited on substrate 11 using molecular beam epitaxy or metal oxide chemical vapor deposition conventional techniques and the subcollector may be doped N+ as it is being deposited. It may have a thickness of 6000 Å and a doping concentration of $4 \times 10^{18}$ (cm$^{-3}$).

The collector layer 15 is next deposited as gallium arsenide and doped N—. It may have a thickness of 7000 Å and a concentration of $4 \times 10^{16}$.

The next layer to be deposited and doped is the base 17 layer of gallium arsenide which is P+ doped. It may have a thickness of approximately 700 Å and a high doping concentration of $1 \times 10^{20}$/cm$^3$.

The next layer deposited is that of emitter 19 which is of aluminum gallium arsenide that is N— doped. The emitter measures about 950 Å in thickness, and is low doped to $5 \times 10^{17}$/cm$^3$.

The cap layer 21-22 is N+ gallium arsenide over the emitter 19 with N+ Indium gallium arsenide 22 over the cap layer 21.

Figure 2:
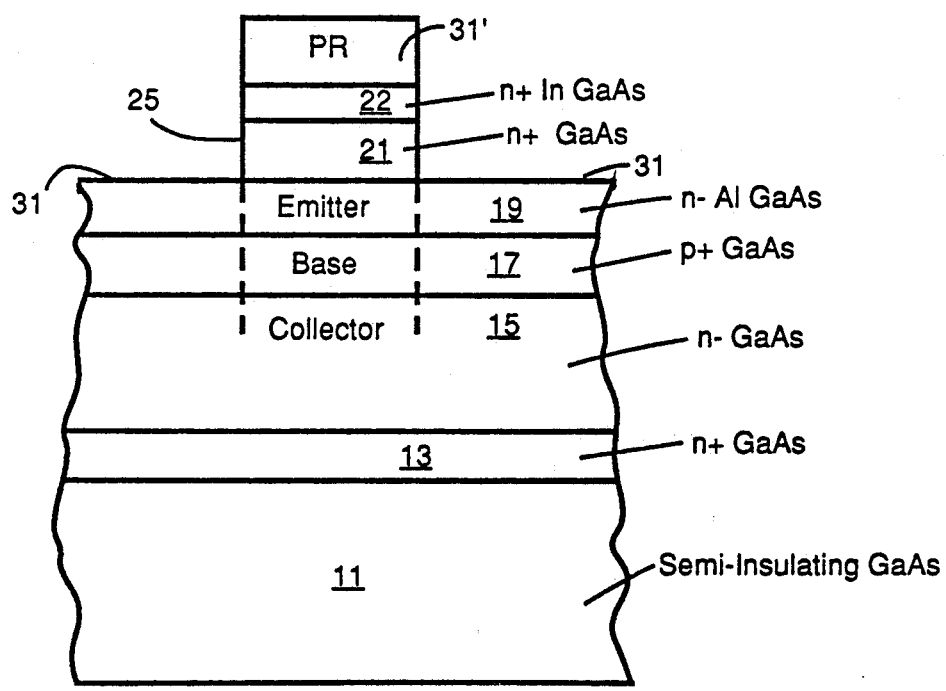
FIG. 2 shows the wafer with photoresist and top of the mesa being formed.

In FIG. 2 now, the beginning of the mesa 25 represents the location of the transistor being grown comprising cap layer 21,22 which may be one of a large number of transistors grown at the same time on semi-insulating substrate 11.

It is therefore very desirable to have each of these transistors of the same height, and consequently, the upper surface 25' (see FIG. 3) of the silicon monoxide 27 and the mesa 25 should be highly planar. This is because HBTs operating in higher frequency realms require nearly perfect planar surfaces to minimize parasites, and maintain operational integrity.

Recent U.S. Pat. No. 4,996,165 entitled "Self-Aligned Dielectric Assisted Planarization Process" to the same inventors, and assigned to a common assignee, issued Feb. 26, 1991, discloses the best known way of planarizing surface 25'. This patent is incorporated by way of reference herein, but the steps leading to FIG. 3 will now be explained.

Figure 3:
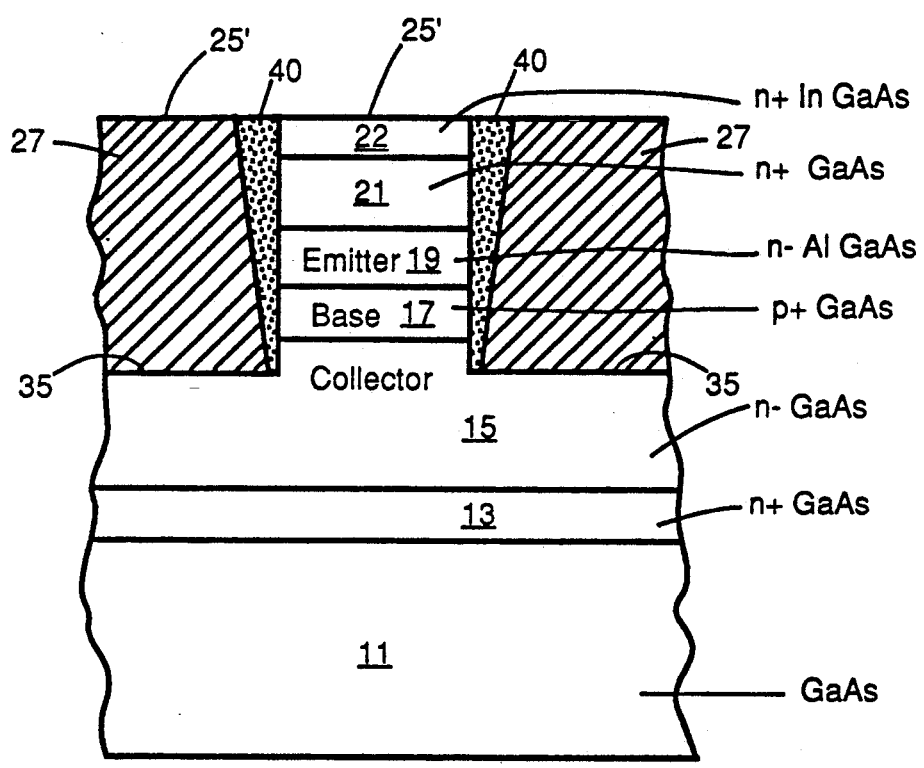
FIG. 3 shows a step in planarizing the mesa and wafer top.

First, a layer of photoresist 31 (best seen in FIG. 1) is deposited on layer 22 and developed and etched down to surface 35 (FIG. 3) to produce the pattern 31' of photoresist in FIG. 2, prior to applying $SiO_x$ 27 of FIG. 3. Preferably, reactive ion etching is utilized because of the substantially vertical sidewalls it provides for the mesas, such as 25, during etching. Photoresist 31' is left in place to cover the upper portions or top of the features being formed in FIG. 2.

Next, the layer of dielectric material 27, preferably $SiO_x$, is deposited on the etched surface 35 between the newly formed mesas 25. $SiO_x$ is a preferred material due to its well understood etching rate and preferred material characteristics which are used in conjunction with the polymer processing described hereinafter. The dielectric material 27 is deposited to a depth which is substantially identical to the height of the mesas 25 (FIG. 3) which in the preferred applications are all the same height. Since the process used to etch the substantially uniform height mesas is well known, and is controllable with high precision, the height of the mesas produced is easily determined. Preferably, the SiO is deposited by evaporation which is highly compatible with desired applications for HBT transistors.

Once the $SiO_x$ dielectric layer 27 has been deposited to the level 25', comparable to the height of mesa 25, the remaining photoresist, such as 31', is removed in conventional manner and the removal of photoresist 31' also removes $SiO_x$ 31" deposited thereon.

This provides a reasonably planar surface 25' (FIG. 3) except for narrow "gaps" or "trenches" 40 (FIG. 3). These gaps are between the $SiO_x$ 27 and the sidewalls of mesa 25. Due to masking and shadow effects normally encountered in photoresist etching, as well as in depositing material into finite depressions close to features covered by a layer of photoresist material, the $SiO_x$ does not interface directly nor completely with the sides of the mesa 25 or similar features. This creates the series of small gaps 40 (shown exaggerated in size) which must be corrected.

Figure 4:
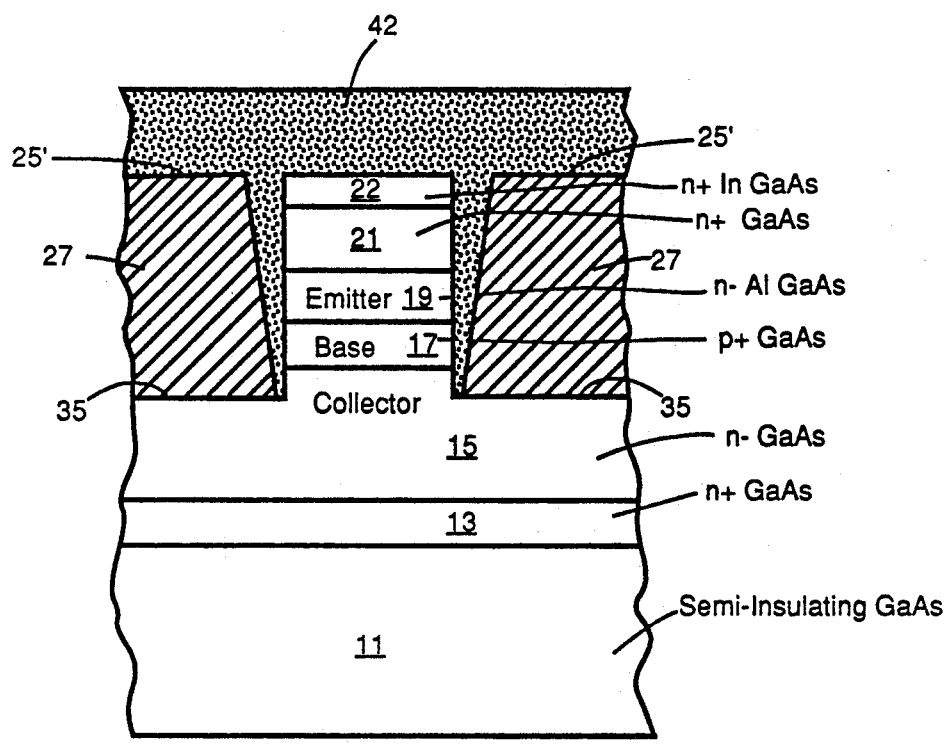
FIG. 4 shows polyimide applied to the mesa periphery for planarization.

As shown in FIG. 4, a layer of polyimide 42 is preferably deposited as a liquid on the surface 25' which is then coated and flows very uniformly over the surface and into the gaps 40. The excess polymer above the gaps 40 is removed preferably in a low pressure reactive ion etching process using oxygen plasma at a vertical inclination of about 0° or substantially perpendicular to the layer of polyimide 42. The RIE is employed because it provides selective etching of the polyimide an does not etch the $SiO_x$ or mesa materials. The reactive ion etching also results in low re-polymerization in the processing chamber. Further materials may now be deposited on the planar surface 25'.

The surface 25' is planar to within about 200 Å or less. Such a high degree of isoplanar refinement now allows greatly improved yield and device integrity with improved inter-level density.

Figure 5:
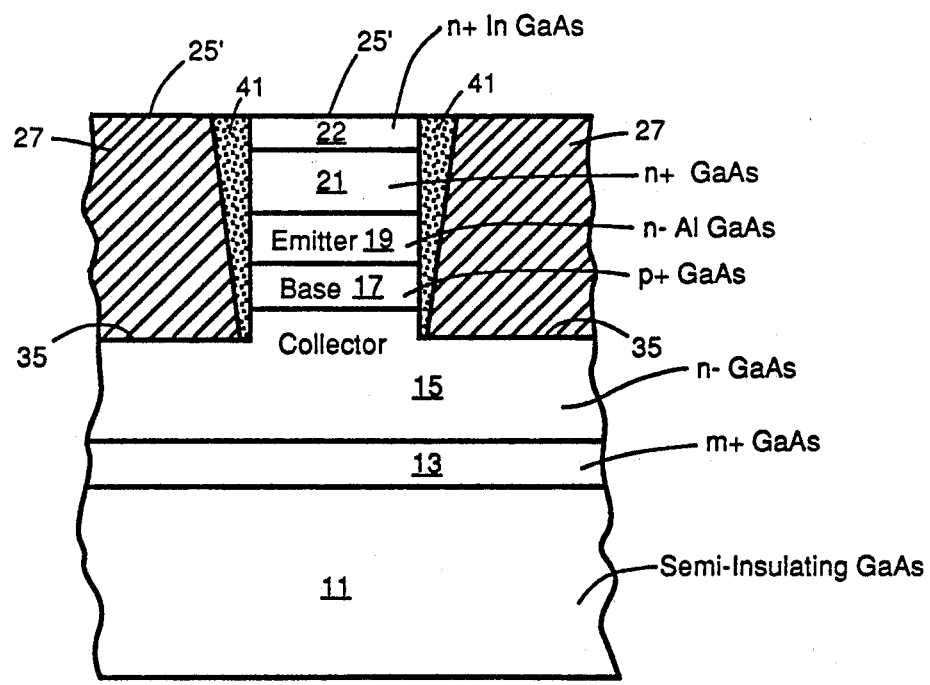
FIG. 5 shows the final planarization.

In FIG. 5, polyimide 42 has been removed except for the gap filler 41, and (optional emitter contact layer 50) of tungsten covers surface 25.

Figure 6:
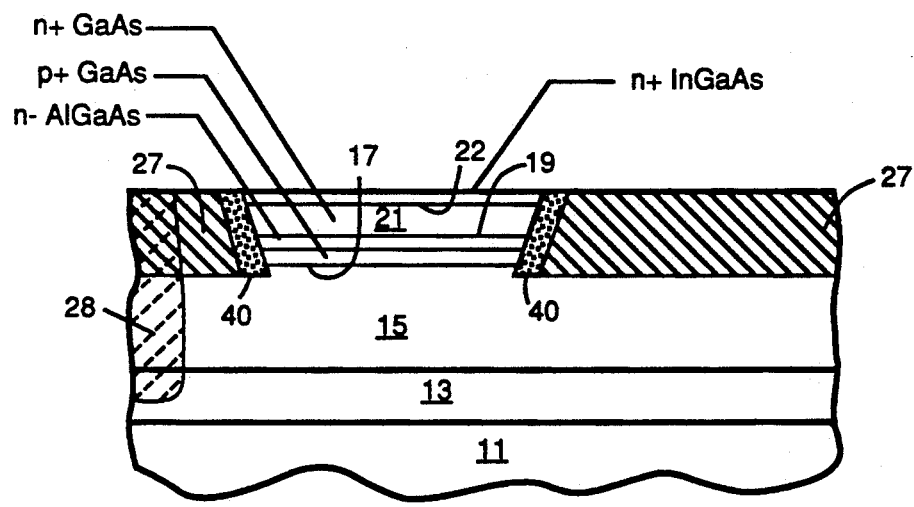
FIG. 6 shows the planarized mesa to a different scale.
Figure 7:
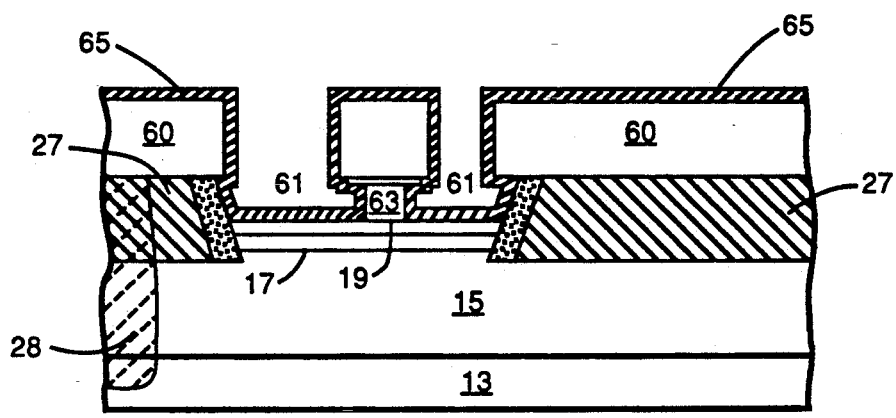
FIG. 7 shows the wafer with the important patterned photoresist including a thin photo CVD layer of silicon nitride covering the periphery of the emitter and the sidewalls of the emitter contact.

FIG. 6 shows device isolation due to ion implant 28.

Next, the important photoresist pattern is developed to provide the base contact region 61,61' around a pedestal 63 including a portion of caps 21,22 and the emitter contact 50'.

To form emitter the pedestal, etching is carried out down to the emitter aluminum gallium arsenide layer 19.

Silicon nitride 65 is then deposited over photoresist 60 as a thin photo-CVD coating which covers the sidewalls of the emitter contact 50' and pedestal 63 and the aluminum gallium arsenide emitter surface 19.

In order to retain silicon nitride 65 on the sidewall and undercut regions of the emitter, a low pressure $CF_4/O_2$ reactive ion etch is used anisotropically.

After the desired silicon nitride is removed, a selective wet etch is used to uncover the center part of the base contact region, and leave a depleted thin aluminum gallium arsenide layer (under protection of the deposited silicon nitride 65") to passivate the emitter periphery, automatically.

Thus, it may be seen that the single photoresist mask 60 self-aligns all critical dimensions and also passivates the emitter at the same time. The base contact 71 is aligned with the ring shaped portion damaged region 71', and with the emitter contact 50' and emitter 19'.

Figure 8:
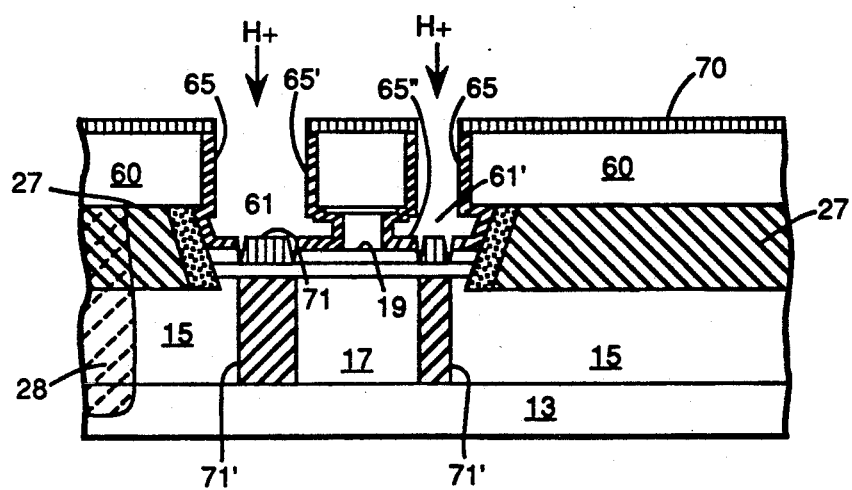
FIG. 8 shows the silicon nitride opened for base contacts over a proton damaged collector region with the base contacts present.

In FIG. 8, after etching has opened the silicon nitride 65 in the base contact region, hydrogen atoms (H+) are used to proton damage the collector 15, in a ring, directly under the contact 71 next to be formed. Base contact metal 70 is deployed over photoresist 60 and forms the oblong contact 71. It can be seen that the silicon nitride 65 insulates the periphery of emitter contact 50' at 65', and covers the emitter periphery out to the base contact 71 at 65".

Figure 9:
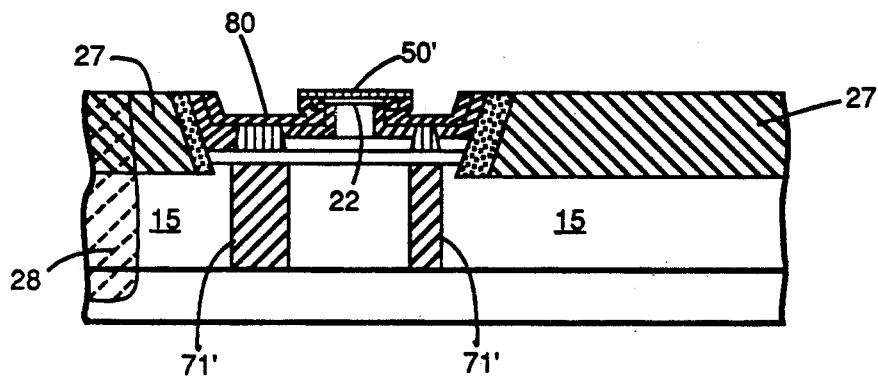
FIG. 9 shows the base contact interconnect.

The foregoing insulation 65' permits non critical deployment of base interconnect 80 without contacting emitter contact 50'. It also permits establishing the emitter metal as contact 50' because the surrounding insulation 65' (FIG. 9) will readily receive a contact deposit anywhere on cap 22 without meeting any critical dimensioning requirement. Interconnect metal, such as titanium/gold can be used.

Figure 10:
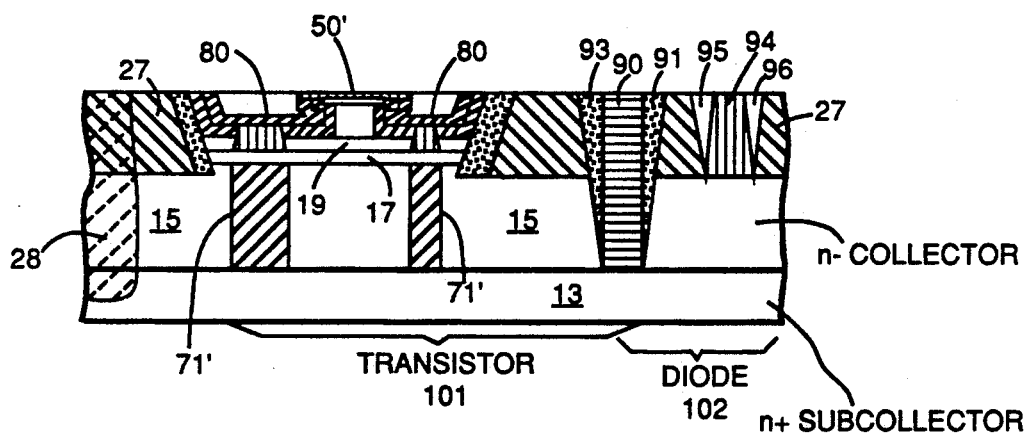
FIG. 10 shows the planarized (with back-filled polyimide) collector contact and a Schottky diode; and, FIG. 11 is a top plan view.

FIG. 10 shows a portion of an IC including the HBT 101 of the present invention and a compatibly produced Schottky diode 102. But first, the collector contact 90 is formed in an etched hole 91 and insulted by polyimide 93. Contact 90 serves as one terminal for diode 102, extending down to N+ gallium arsenide subcollector 13. The other terminal is Schottky contact 94, in hole 96, also insulated by polyimide 95 and extending to N− gallium arsenide collector 15.

It should be noted that, in FIG. 8, when photoresist 60 is lifted off, surplus base contact metal 70 and silicon nitride 65 are also automatically removed. Devices with emitter width down to 1 um have been realized. Excellent transistor characteristics have been obtained with the process. With a very high base doping concentration of $1 \times 10^{20}/cm^3$ and a low emitter doping of $5 \times 10^{17}/cm^3$, the device current gain has reached 15. Comparing to HBTs made by a conventional dual lift-off process on similarly grown wafers, the current gain of advanced dual lift-off HBTs is at least two times higher.

With further optimization in device layout, it is expected to achieve an even higher current gain in advanced dual lift-off HBTs with an islanded emitter structure. Comparing to the wall emitter structure of the prior art, the island emitter structure, which is passivated in all directions, is more compatible with a self-passivation process. The advanced dual lift-off HBTs, which posses low device parasitics and relatively high current gains, can provide the best performance, efficiency and manufacturability for future analog/digital combination circuits.

Figure 11:
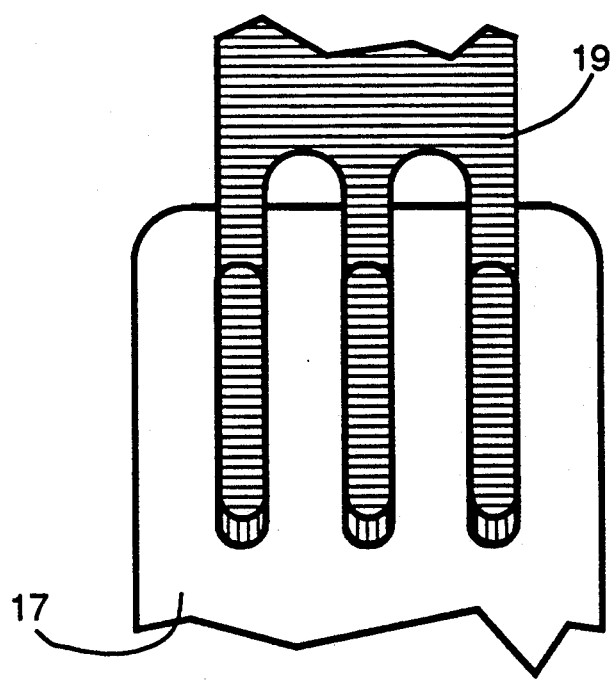

FIG. 11 shows base 17 and collector 19 as viewed in plan.

A PNP device can be made simply by using a P− aluminum gallium arsenide emitter layer 19, an N+ base layer 17 of gallium arsenide, and a P− gallium arsenide collector 15 in the above process.

What is claimed is:

1. A self-aligned and self-passivated heterojunction bipolar transistor process, comprising the steps of:
    forming a semiconductor wafer including an undoped substrate, an N+ gallium arsenide subcollector layer over the substrate, a gallium arsenide collector layer doped one type over the subcollector, a gallium arsenide base layer doped a different type from said one type over the collector layer, an aluminum gallium arsenide emitter layer doped said one type over the base layer, and a pair of cap layers, one over the emitter layer and the other over the one cap layer;
    forming a mesa for a single transistor consisting of the cap layers, emitter layer, base layer and part of the collector layer;
    planarizing the mesa with insulation to isolate a single transistor;
    depositing a layer of photoresist at least over the mesa;
    forming a photoresist mask out of the photoresist, characterized by an emitter region pedestal surrounded by an emitter peripheral region and a base contact region, by etching the photoresist through the cap layers to stop at the emitter layer;
    depositing a thin photo CVD layer of silicon nitride over the etched photoresist to cover the sidewalls of the pedestal, the sidewalls of the base contact region and the emitter peripheral region and base contact region;
    removing the silicon nitride from the top of the photoresist and the base contact region by using low pressure carbon tetrafluoride oxygen plasma anisotropic reactive ion etching to preserve the sidewall silicon nitride;
    selectively wet etching the base contact region to the base layer and depleting the emitter peripheral region aluminum gallium arsenide under the silicon nitride to passivate the emitter peripheral region;
    proton damaging the collector region beneath the base contact region;
    depositing base metal on the photoresist and in the base contact region;
    removing the photoresist and photoresist top of the pedestal along with the silicon nitride affixed thereto and the base metal not used for the base contact; and
    finishing a contact to the subcollector and a contact to the emitter.

2. The process of claim 1, comprising the further steps of:
    etching an opening through said insulation, and through the collector layer to the subcollector layer for said contact to the subcollector;
    depositing collector contact metal in said opening; and,
    isolating the contact metal.

3. The process of claim 2, comprising the further steps of:
    establishing an opening through said insulation to the collector layer; and,
    depositing Schottky contact material in said opening to form a diode using the subcollector contact of said transistor as the second contact for the diode.

4. A self-aligned and self-passivated heterojunction bipolar transistor process, comprising the steps of:
    forming a semiconductor wafer including an undoped substrate, an N+ gallium arsenide subcollector layer over the substrate, a gallium arsenide collector layer doped one type over the subcollector, a gallium arsenide base layer doped a different type from said one type over the collector layer, an aluminum gallium arsenide emitter layer doped said one type over the base layer, and a pair of cap layers, one over the emitter layer and the other over the one cap layer;
    forming a mesa for a single transistor consisting of the cap layers, emitter layer, base layer and part of the collector layer;
    planarizing the mesa with insulation to isolate a single transistor;
    depositing a layer of photoresist at least over the mesa;
    forming a photoresist mask out of the photoresist, characterized by an emitter region pedestal surrounded by an emitter peripheral region and a base contact region, by etching the photoresist through the cap layers to stop at the emitter layer;
    depositing a thin photo CVD layer of silicon nitride over the etched photoresist to cover the sidewalls of the pedestal, the sidewalls of the base contact region and the emitter peripheral region and base contact region;
    removing the silicon nitride from the top of the photoresist and the base contact region by using low pressure carbon tetrafluoride oxygen plasma anisotropic reactive ion etching to preserve the sidewall silicon nitride;
    selectively wet etching the base contact region to the base layer and depleting the emitter peripheral region aluminum gallium arsenide under the silicon nitride to passivate the emitter peripheral region;
    proton damaging the collector region beneath the base contact region;
    depositing base metal on the photoresist and in the base contact region;
    removing the photoresist and photoresist top of the pedestal along with the silicon nitride affixed thereto and the base metal not used for the base contact; and
    finishing a contact to the subcollector and to the said other cap layer for the emitter.

5. A self-aligned and self-passivated heterojunction bipolar transistor process, comprising the steps of:
    forming a semiconductor wafer including an undoped substrate, an N+ gallium arsenide subcollector layer over the substrate, a gallium arsenide collector layer doped one type over the subcollector, a gallium arsenide base layer doped a different type from said one type over the collector layer, an aluminum gallium arsenide emitter layer doped said one type over the base layer, and a pair of cap layers, one over the emitter layer and the other over the one cap layer;

forming a mesa for a single transistor consisting of the cap layers, emitter layer, base layer and part of the collector layer;

planarizing the mesa with insulation to isolate a single transistor;

depositing a layer of photoresist at least over the mesa;

forming a photoresist mask out of the further photoresist, characterized by an emitter region pedestal surrounded by an emitter peripheral region and a base contact region, by etching the photoresist through the cap layers to stop at the emitter layer;

depositing a thin photo CVD layer of silicon nitride over the etched photoresist to cover the sidewalls of the pedestal, the sidewalls of the base contact region and the emitter peripheral region and base contact region;

removing the silicon nitride from the top of the photoresist and the base contact region by using low pressure carbon tetrafluoride oxygen plasma anisotropic reactive ion etching to preserve the sidewall silicon nitride;

selectively wet etching the base contact region to the base layer and depleting the emitter peripheral region aluminum gallium arsenide under the silicon nitride to passivate the emitter peripheral region;

proton damaging the collector region beneath the base contact region;

depositing base metal on the photoresist and in the base contact region;

removing the photoresist and photoresist top of the pedestal along with the silicon nitride affixed thereto and the base metal not used for the base contact; and finishing a contact to the subcollector and to the pedestal layer of said other cap layer for the emitter.

6. A self-aligned and self-passivated heterojunction bipolar transistor process, comprising the steps of:

forming a semiconductor wafer including an undoped substrate, an N+ gallium arsenide subcollector layer over the substrate, a gallium arsenide collector layer doped one type over the subcollector, a gallium arsenide base layer doped a different type from said one type over the collector layer, an aluminum gallium arsenide emitter layer doped said one type over the base layer, and a pair of cap layers, one over the emitter layer and the other over the one cap layer;

forming a mesa for a single transistor consisting of the cap layers, emitter layer, base layer and part of the collector layer;

planarizing the mesa with insulation to isolate a single transistor;

depositing a layer of photoresist at least over the mesa;

delineating an emitter contact location;

depositing a further layer of photoresist over the mesa;

forming a photoresist mask out of the further photoresist, characterized by an emitter region pedestal including an emitter contact, surrounded by an emitter peripheral region and a base contact region, by etching the further photoresist through the cap layers to stop at the emitter layer;

depositing a thin photo CVD layer of silicon nitride over the etched photoresist to cover the sidewalls of the pedestal, the sidewalls of the base contact region and the emitter peripheral region and base contact region;

removing the silicon nitride from the top of the photoresist and the base contact region by using low pressure carbon tetrafluoride oxygen plasma anisotropic reactive ion etching to preserve the sidewall silicon nitride;

selectively wet etching the base contact region to the base layer and depleting the emitter peripheral region aluminum gallium arsenide under the silicon nitride to passivate the emitter peripheral region;

proton damaging the collector region beneath the base contact region;

depositing base metal on the photoresist and in the base contact region;

removing the photoresist and photoresist top of the pedestal along with the silicon nitride affixed thereto and the base metal not used for the base contact; and finishing a contact to the subcollector and a contact to the emitter in said emitter contact location.

* * * * *

UNITED STATES PATENT AND TRADEMARK OFFICE
CERTIFICATE OF CORRECTION

PATENT NO. : 5,185,274

DATED : February 9, 1993

INVENTOR(S) : Mau-Chung F. Chang, Wu-Jing Ho, Peter M. Asbeck

It is certified that error appears in the above-identified patent and that said Letters Patent is hereby corrected as shown below:

On the title page: Item [75]
change Inventors to read:

Inventors: Mau-Chung F. Chang, Thousand Oaks; Wu-Jing Ho, Thousand Oaks; Peter M. Asbeck, San Diego, all of California.

Signed and Sealed this

Seventh Day of December, 1993

Attest:

BRUCE LEHMAN

Attesting Officer    Commissioner of Patents and Trademarks